United States Patent
Kimura et al.

(10) Patent No.: US 9,164,275 B2
(45) Date of Patent: Oct. 20, 2015

(54) DISPLAY DEVICE

(75) Inventors: Yasukazu Kimura, Chiba (JP); Jun Fujiyoshi, Mobara (JP); Takeshi Kuriyagawa, Mobara (JP); Daisuke Sonoda, Chiba (JP)

(73) Assignee: Pixtronix, Inc., San Diego, CA (US)

( * ) Notice: Subject to any disclaimer, the term of this patent is extended or adjusted under 35 U.S.C. 154(b) by 721 days.

(21) Appl. No.: 13/486,280

(22) Filed: Jun. 1, 2012

(65) Prior Publication Data
US 2012/0306830 A1    Dec. 6, 2012

(30) Foreign Application Priority Data
Jun. 3, 2011    (JP) .................................. 2011-125337

(51) Int. Cl.
*G02B 26/00*    (2006.01)
*G09G 5/00*    (2006.01)
(Continued)

(52) U.S. Cl.
CPC . *G02B 26/02* (2013.01); *B32B 3/00* (2013.01); *B81B 7/02* (2013.01); *B81C 1/00103* (2013.01);
(Continued)

(58) Field of Classification Search
CPC ........ G02B 26/00; G02B 26/02; G02B 26/04; G02B 26/023; H02N 1/006; B81C 1/00103; G09G 3/34; G09G 3/3433; G09G 3/3426; G09G 5/00; G09G 5/10; G09G 2300/08; B81B 3/0062; B81B 3/0064; B81B 7/0003; B81B 7/02; B81B 2201/047; B81B 2203/01; B81B 2203/00
USPC .................. 359/290–295, 298, 227, 230, 233; 345/84, 85, 204, 205, 212, 501, 520, 345/531, 690; 362/97.1
See application file for complete search history.

(56) References Cited

U.S. PATENT DOCUMENTS 5,774,256 A    6/1998  Min et al.
7,405,852 B2 *  7/2008  Brosnihan et al. ......... 359/198.1
(Continued)

FOREIGN PATENT DOCUMENTS

CN    1479153 A    3/2004
JP    H08248333 A    9/1996
(Continued)

OTHER PUBLICATIONS

Taiwan Search Report—TW101116084—TIPO—Jun. 17, 2014.
(Continued)

*Primary Examiner* — Loha Ben
(74) *Attorney, Agent, or Firm* — Edward A. Gordon; Foley & Lardner LLP

(57) ABSTRACT

A display device includes: a plurality of pixels each having a shutter plate formed and an actuator portion, wherein the actuator portion has a beam portion connected to the shutter plate, a drive electrode causing the beam portion to bend to drive the shutter plate, a first supporting portion supporting the drive electrode and fixed on a substrate, and a second supporting portion supporting the beam portion and fixed on the substrate, at least one of the first supporting portion and the second supporting portion has a planar portion, and a recessed portion formed to be concaved from the planar portion and connected to the substrate, and the recessed portion has a vertically formed portion formed to be inclined substantially vertically from the planar portion, and a portion starting from the vertically formed portion and formed such that the inclination of the portion becomes gentle toward the substrate.

6 Claims, 13 Drawing Sheets

(51) Int. Cl.
  *G09G 5/10* (2006.01)
  *G02B 26/02* (2006.01)
  *G02B 26/04* (2006.01)
  *B81B 7/02* (2006.01)
  *G09G 3/34* (2006.01)
  *B32B 3/00* (2006.01)
  *B81C 1/00* (2006.01)
  *H02N 1/00* (2006.01)
  *B81B 3/00* (2006.01)

(52) U.S. Cl.
  CPC  *G02B 26/04* (2013.01); *G09G 3/34* (2013.01); *G09G 5/10* (2013.01); *H02N 1/006* (2013.01); *B81B 3/0062* (2013.01); *B81B 2201/047* (2013.01); *B81B 2203/0307* (2013.01); *B81B 2203/0376* (2013.01); *G02F 2203/12* (2013.01); *G09G 2300/08* (2013.01)

(56) References Cited

U.S. PATENT DOCUMENTS

| | | | |
|---|---|---|---|
| 8,169,679 B2* | 5/2012 | Wu et al. | 359/234 |
| 8,526,096 B2* | 9/2013 | Steyn et al. | 359/290 |
| 2006/0250325 A1 | 11/2006 | Hagood et al. | |
| 2010/0003460 A1 | 1/2010 | Bolle et al. | |
| 2010/0110518 A1 | 5/2010 | Wu et al. | |

FOREIGN PATENT DOCUMENTS

| | | |
|---|---|---|
| JP | H09211019 A | 8/1997 |
| JP | 2001522072 A | 11/2001 |
| JP | 2004338044 A | 12/2004 |
| JP | 2005186207 A | 7/2005 |
| JP | 2008-197668 | 8/2008 |
| JP | 2008-533510 | 8/2008 |
| TW | 200426400 | 12/2004 |
| WO | 9923832 A1 | 5/1999 |
| WO | WO 2006/091738 A1 | 8/2006 |
| WO | WO 2006/091860 A2 | 8/2006 |
| WO | 2010062616 A2 | 6/2010 |

OTHER PUBLICATIONS

European Search Report—EP12170726—Search Authority—Munich—Sep. 25, 2012.

Legtenberg, R. et al, "Electrostatic microactuators with integrated gear linkages for mechanical power transmission", Micro Electro Mechanical Systems, 1996, Mems '96, Proceedings. An Inve Stigation of Micro Structures, Sensors, Actuators, Machines and System S. IEEE, The Ninth Annual International Workshop on San Diego, CA USA Feb. 11-15, 1996, New York, NY, USA Feb. 11, 1996, pp. 204-209.

Wagner B. et al, "Microfabrication of complex surface topographies using grey-tone lithography", Sensors and Actuators A, Elsevier Sequoia, S.A., Lausanne, CH, vol. 46, No. 1-3, Jan. 1, 1995, pp. 89-94.

* cited by examiner

DISPLAY DEVICE

CROSS-REFERENCE TO RELATED APPLICATION

The present application claims priority from Japanese application JP2011-125337 filed on Jun. 3, 2011, the content of which is hereby incorporated by reference into this application.

BACKGROUND OF THE INVENTION

1. Field of the Invention

The present invention relates to a display device.

2. Description of the Related Art

Displays which form an image by opening and closing a shutter which is based on MEMS (Micro Electro Mechanical Systems) and disposed in each of pixels of a display device have been known.

As such a display device, for example, JP 2008-197668 A discloses a backlit display in which a MEMS-based mechanical light modulator is used. Moreover, also JP 2008-533510 T discloses a display device having a MEMS-based light modulator incorporated therein. JP 2008-533510 T describes that a manufacturing method of the display device is compatible with a manufacturing process of a liquid crystal display.

SUMMARY OF THE INVENTION

In a display device having a shutter assembly as a light modulator in each of a plurality of pixels, the shutter assembly is configured to have a shutter plate formed in a plate shape and an actuator portion which drives the shutter plate with an electrostatic force.

Since the shutter plate needs to be movably suspended over a substrate, it is conceivable that a process of a lithography step using a sacrificial layer may be applicable to the manufacturing of the shutter assembly, for example.

FIGS. 8A to 8H show one reference example which is conceivable as a method for manufacturing the shutter assembly using a sacrificial layer. In manufacturing steps in the reference example, a resist RSa and a resist RSb each serving as a sacrificial layer are first formed by two lithography steps as shown in FIGS. 8A and 8B. Next as shown in FIG. 8C, a conductor layer AS and a metal layer AL are deposited. Thereafter, a resist RSc applied on the metal layer AL is processed through a further lithography step as shown in FIG. 8D, the metal layer AL is removed by wet etching (FIG. 8E), and the conductor layer AS is removed by anisotropic dry etching excepting a portion formed on the side-wall of the resist RSb (FIG. 8F). Then, the resist RSa and the resist RSb are removed after the anisotropic dry etching (FIG. 8G), and an insulating layer IS is deposited on the entire left structure, whereby a first supporting portion S1, a shutter plate SH, and the like are formed (FIG. 8H).

Accordingly, in the reference example, the lower portion of the structure formed so as not to be suspended over a substrate and the upper portion thereof are formed in different lithography steps, as can be seen in the first supporting portion S1 of FIG. 8H.

However, when the shutter assembly is manufactured in the manner shown in FIGS. 8A to 8H, the non-uniformity of film stress is produced due to the misalignment of position adjustment which may occur in different lithography steps, causing distortion in the shutter assembly in some cases.

The invention focuses on the problem described above, and it is an object of the invention to provide a display device having a shutter assembly based on MEMS, in which the occurrence of distortion of the shutter assembly is suppressed.

For solving the problem described above, a display device according to the invention includes: a plurality of pixels each having a shutter plate formed in a plate shape and an actuator portion driving the shutter plate with an electrostatic force, wherein the actuator portion has a beam portion connected to the shutter plate, a drive electrode causing, in response to the application of a voltage thereto, the beam portion to bend to drive the shutter plate, a first supporting portion supporting the drive electrode and fixed on a substrate, and a second supporting portion supporting the beam portion and fixed on the substrate, at least one of the first supporting portion and the second supporting portion has a planar portion formed in a planar shape apart from the substrate, and a recessed portion formed to be concaved from the planar portion and connected to the substrate, and the recessed portion has a vertically formed portion formed to be inclined substantially vertically from the planar portion, and a portion starting from the vertically formed portion and formed such that the inclination of the portion becomes gentle toward the substrate.

In one aspect of the display device according to the invention, the drive electrode and the beam portion may be formed on the side of the substrate relative to the planar portion.

Moreover, in one aspect of the display device according to the invention, the drive electrode and the beam portion may be formed with an aspect ratio greater in the depth direction than in the width direction.

Moreover, in one aspect of the display device according to the invention, the first supporting portion may have the recessed portion, and the drive electrode may be formed, in plan view, such that an outer extension thereof is formed with a structure having the aspect ratio and that an inside thereof is hollow.

Moreover, in one aspect of the display device according to the invention, the drive electrode and the beam portion may be formed to a position deeper than the shutter plate.

Moreover, in one aspect of the display device according to the invention, a tip of each of the drive electrode and the beam portion may be formed to be pointed on the side of the substrate.

According to the invention, it is possible to provide a display device in which the occurrence of distortion of a shutter assembly is suppressed.

DETAILED DESCRIPTION OF THE INVENTION

Hereinafter, embodiments of the invention will be described with reference to the drawings.

[First Embodiment]

Figure 1:
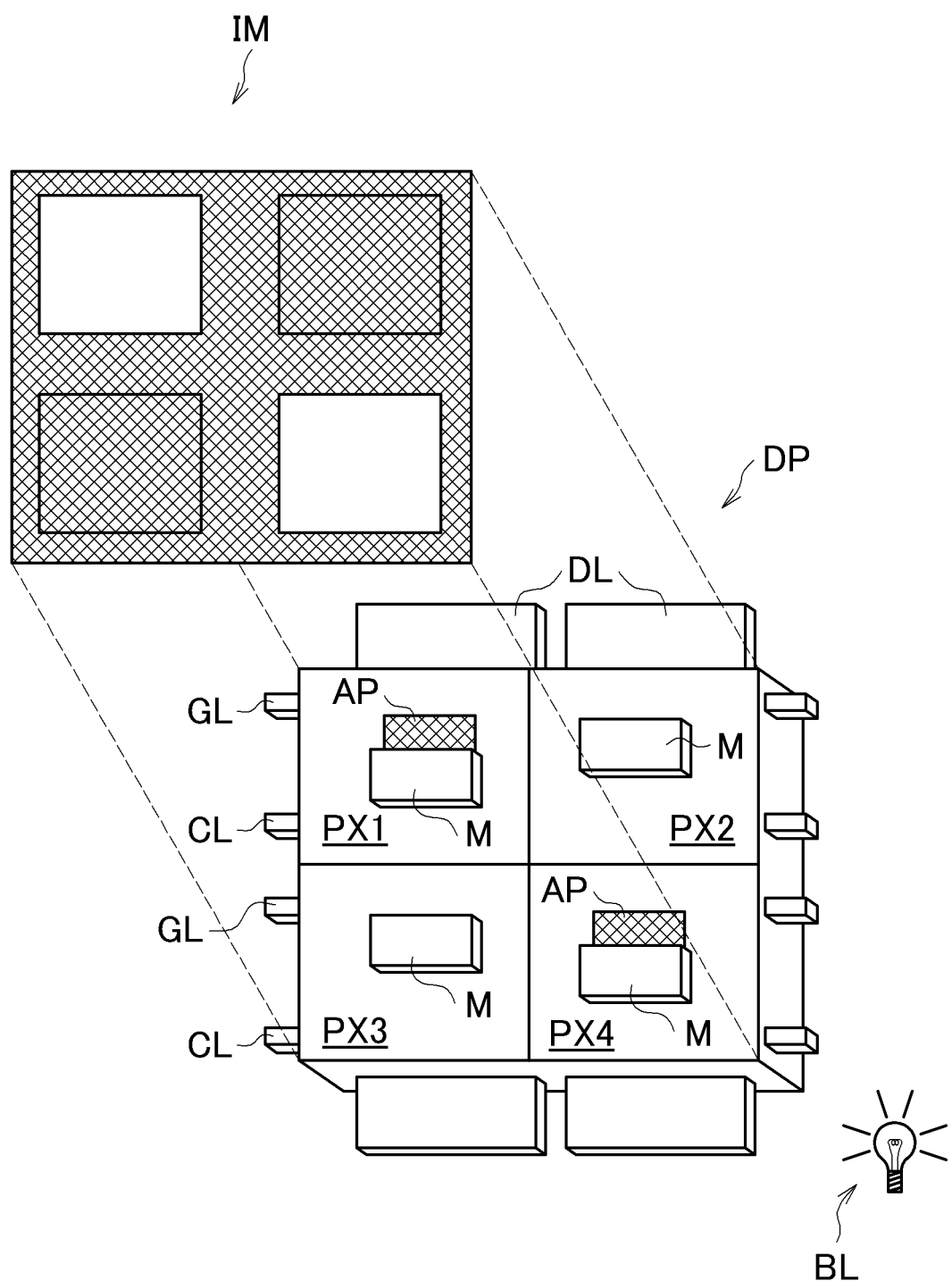
FIG. 1 is a schematic view schematically showing a display device according to a first embodiment of the invention.

FIG. 1 is a schematic view of a display device DP according to a first embodiment of the invention. The display device DP has a shutter assembly M as a light modulator in each of a plurality of pixels disposed in a matrix. In the schematic view of FIG. 1, pixels PX1 and PX4 are brought into an open state to allow light of a backlight BL from an aperture AP to pass therethrough, and display white in an image IM. Pixels PX2 and PX3 are brought into a closed state to prevent light of the backlight BL from passing therethrough, and display black in the image IM.

Moreover, the display device DP is configured to include a first substrate having a switching element in each of the plurality of pixels and a second substrate disposed to face the first substrate. The shutter assembly M is disposed between the first substrate and the second substrate.

Figure 2:
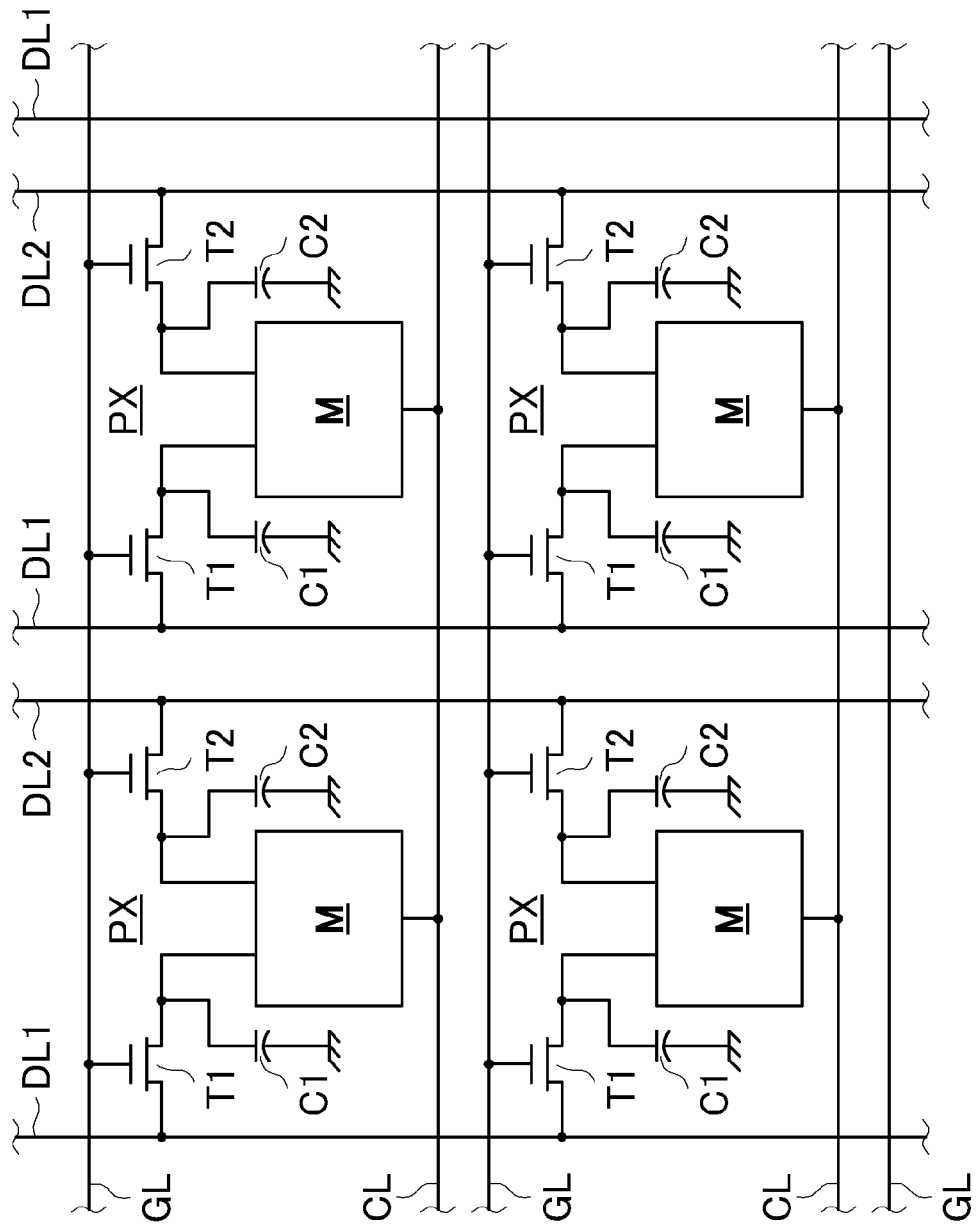
FIG. 2 shows an equivalent circuit of a first substrate in the first embodiment.

FIG. 2 shows an equivalent circuit of the first substrate in the embodiment. As shown in the drawing, a number of scanning signal lines GL and common signal lines CL extend in the horizontal direction in the drawing, and a number of first video signal lines DL1 and second video signal lines DL2 extend in the vertical direction in the drawing. Each of pixels PX is configured to include two thin film transistors T1 and T2 and two capacitors C1 and C2. The gate of the thin film transistor T1 is electrically connected to the scanning signal line GL, the drain thereof is electrically connected to the first video signal line DL1, and the source thereof is electrically connected to the capacitor C1 and an actuator portion of the shutter assembly M. The thin film transistor T2 is also connected in the same manner.

The scanning signal line GL performs, in response to the application of a voltage thereto at a predetermined timing, the selection of a pixel row. The selection of a pixel row by the scanning signal line GL is sequentially performed. In accordance with the timing of the selection, a video signal is supplied to the shutter assembly M from one of or both of the first video signal line DL1 and the second video signal line DL2.

The first video signal line DL1 and the second video signal line DL2 (hereinafter, these are also referred to simply as video signal line DL) supply the shutter assembly M with a video signal for bringing the shutter assembly M into the open state or the closed state. Specifically, the shutter assembly M is driven so as to bring the pixel PX into the open state with a video signal from the first video signal line DL1, while the shutter assembly M is driven so as to bring the pixel PX into the closed state with a video signal from the second video signal line DL2. After writing of a video signal, the scanning signal line GL connected to the pixel to which the video signal has been supplied is grounded, so that the state of the shutter assembly M is maintained.

The common signal line CL supplies the shutter assembly M with a predetermined reference potential. As will be described in detail, the shutter assembly M in the embodiment is driven by an electrostatic force generated by a potential difference between a video signal from the video signal line DL and a reference potential from the common signal line CL.

A video signal line drive circuit, which is not shown in FIG. 2, is connected to the plurality of first video signal lines DL1 and the plurality of second video signal lines DL2. The video signal line drive circuit in the embodiment first determines, based on the state of a pixel to which a video signal is input, whether a shutter plate of the shutter assembly M should be moved to the side of the open state or to the side of the closed state. In the case of moving the shutter plate to the side of the closed state, a video signal is output to the first video signal line DL1 to supply a voltage required for operation of the actuator portion of the shutter assembly M, and the second video signal line DL2 is grounded. On the other hand, in the case of moving the shutter plate to the side of the open state, a video signal is output to the second video signal line DL2 to supply a voltage required for operation of an actuator portion, and the first video signal line DL1 is grounded.

Here, the shutter assembly M in the embodiment will be described.

Figure 3A:
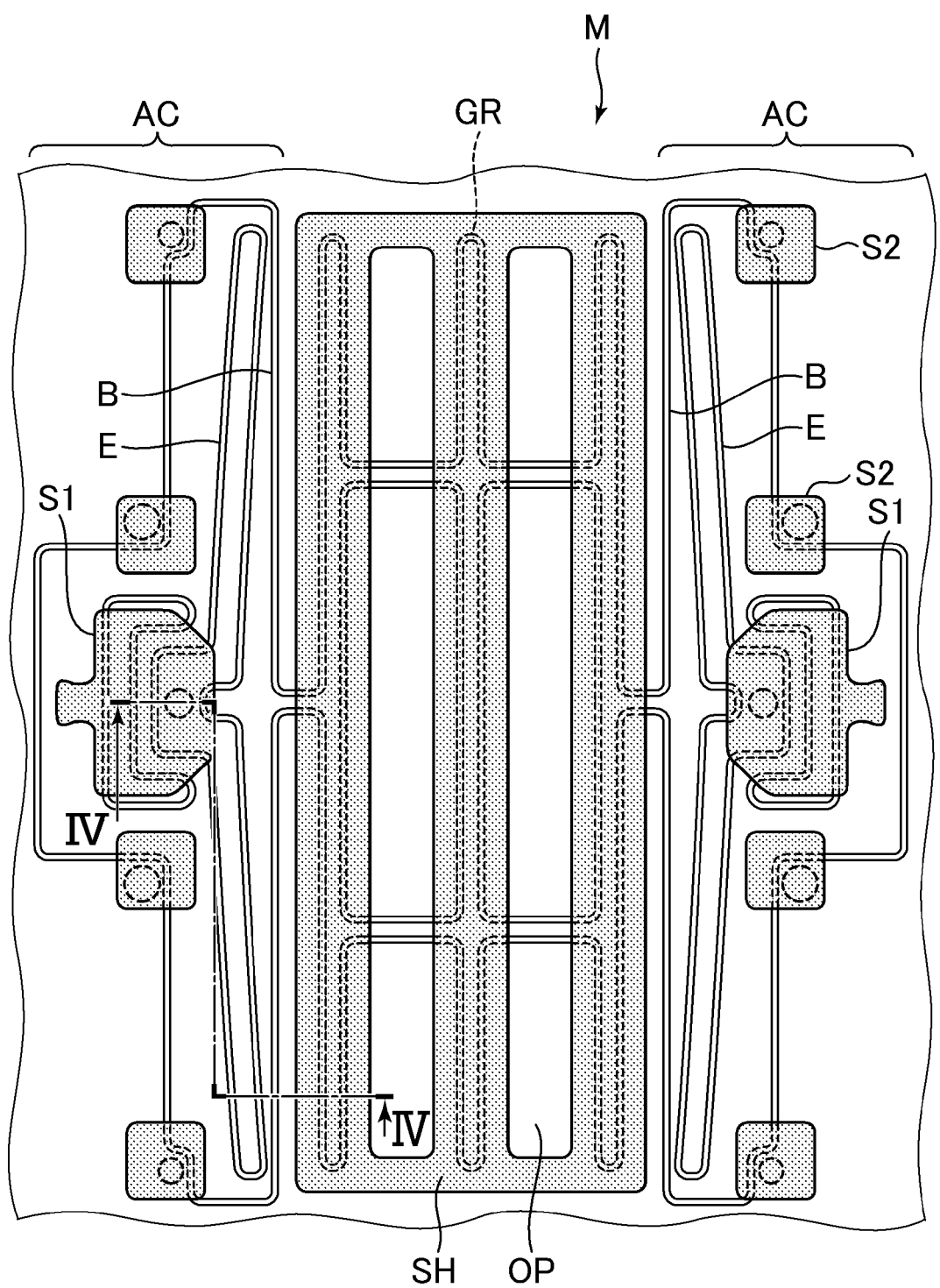
FIG. 3A is a plan view showing a pixel region in the display device of the first embodiment.
Figure 3B:
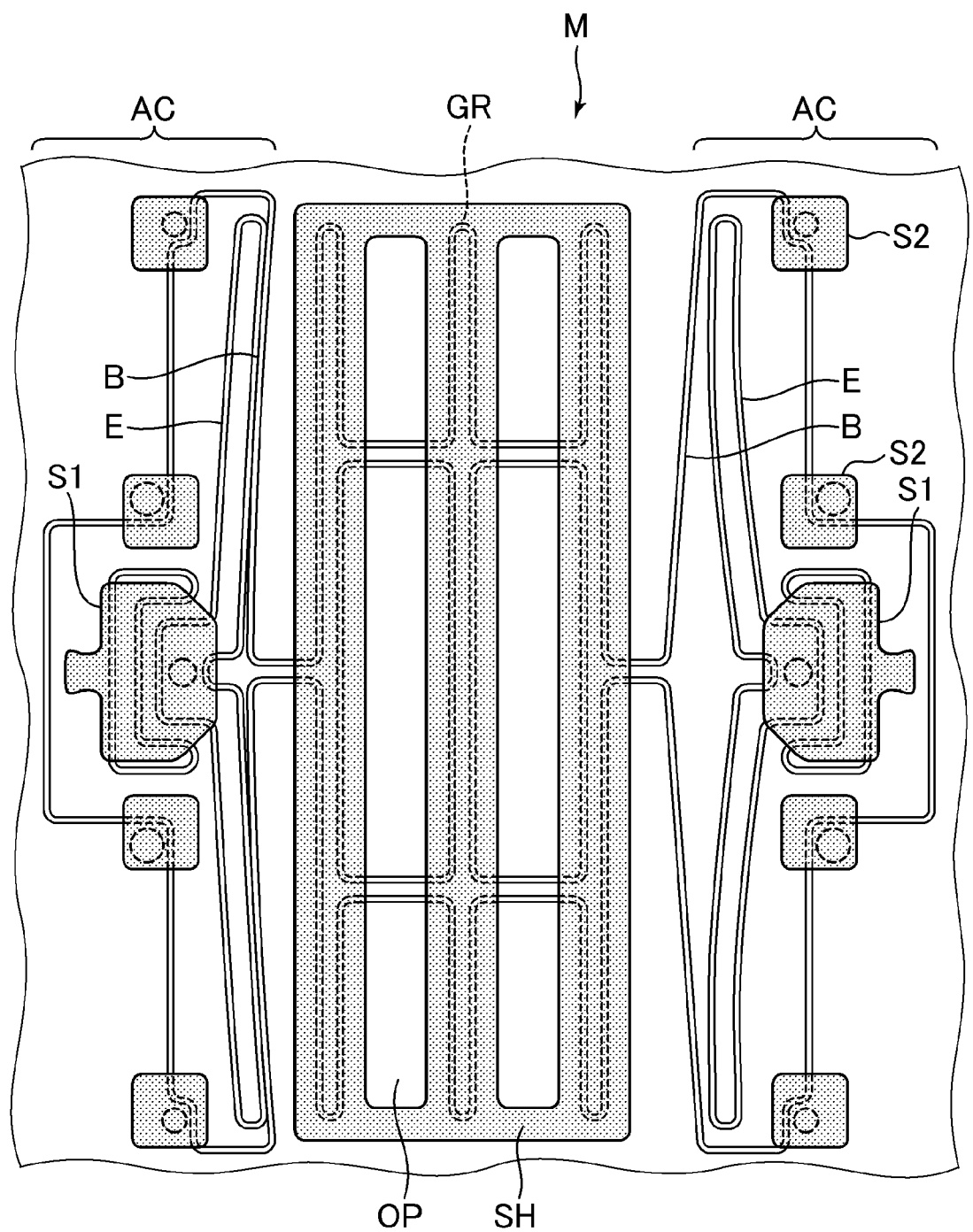
FIG. 3B is a plan view showing the pixel region in the display device of the first embodiment.

FIGS. 3A and 3B are enlarged plan views each showing a pixel region in the display device of the embodiment. The shutter assembly M is configured to have a shutter plate SH formed in a plate shape and two actuator portions AC. The position of the shutter plate SH is controlled by the actuator portions AC. FIG. 3A shows a state where a video signal is not supplied to the two actuator portions AC, while FIG. 3B shows a manner in which a video signal is input from the first video signal line DL1 to provide black display.

In FIG. 3B, the aperture AP (not shown) is disposed at a position overlapping with the shutter plate SH, so that light from the backlight BL is blocked by the shutter plate SH to provide black display. Contrary to FIG. 3B, when the shutter plate SH is moved to a position shifted to the right direction in the drawing, two openings OP of the shutter plate SH overlap with the aperture AP (not shown), so that light from the backlight BL is not blocked, thereby providing white display.

The actuator portion AC has a function of generating an electrostatic force with a signal from the video signal line DL to change the position of the shutter plate SH. The actuator portion AC in the embodiment is configured to include a drive electrode E, a beam portion B connected to the shutter plate SH, a first supporting portion S1 supporting the drive electrode E, and second supporting portions S2 supporting the beam portion B. As shown in FIG. 3A and the like, the beam portion B is a beam-like structure diverging in the up and down directions from the center of the shutter plate SH, and supported by the second supporting portions S2 formed on the first substrate. The drive electrode E is supported by the first supporting portion S1 on the first substrate, disposed so as to face the beam portion B, and electrically connected to the source of the thin film transistor T1 or T2.

Figure 4:
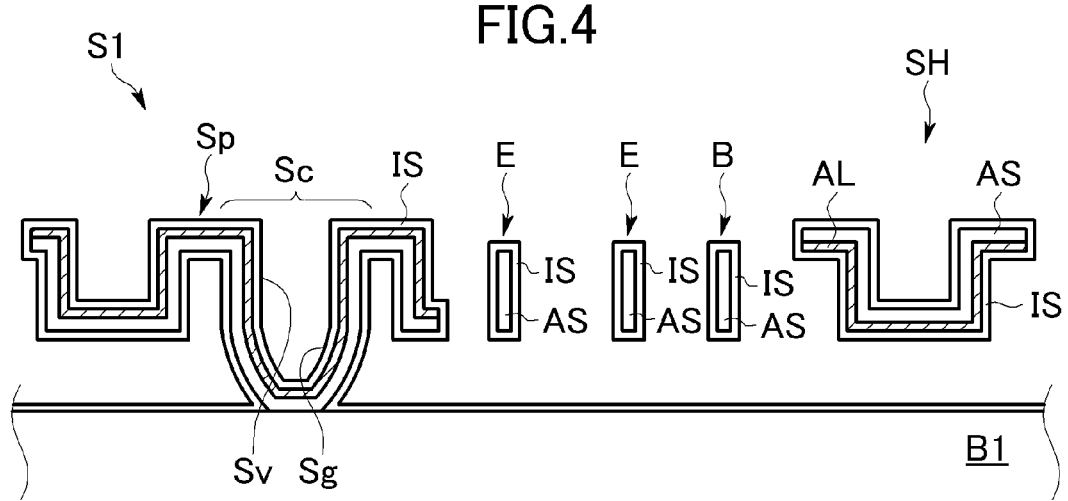
FIG. 4 is a cross-sectional view showing a IV-IV cross-section in FIG. 3A.

FIG. 4 shows a IV-IV cross-section in FIG. 3A. As shown in the drawing, the actuator portion AC and the shutter plate SH are configured to include a conductor layer AS having conductivity, a metal layer AL, and an insulating layer IS surrounding the circumferences of the conductor layer AS and the metal layer AL. When a video signal from the video signal line DL is input to the actuator portion AC, electric charge is accumulated in the conductor layer AS of the drive electrode E through the first supporting portion S1. On the other hand, a reference potential from the common signal line CL is input to the shutter plate SH through the second supporting portions S2 and the beam portion B. With the input of the video signal, an electrostatic force is generated between the drive electrode E and the beam portion B, so that the drive electrode E and the beam portion B are brought into contact with each other. In their contact with each other, insulation between the drive electrode E and the beam portion B is maintained with the insulating layer IS, the beam portion B is deformed by being attracted to the drive electrode E by the generated electrostatic force, and the shutter plate SH is slid in the substrate in-plane direction to a position where restoring force due to the deformation and the electrostatic force are balanced with each other (refer to FIG. 3B).

Especially here, manufacturing steps of the shutter assembly M in the embodiment will be described using FIGS. 5A to 5H, and a mechanical structure of the shutter assembly M will be described in view of the manufacturing steps. FIGS. 5A to 5H each show a portion corresponding to the IV-IV cross-section in FIG. 3A.

Figure 5A:
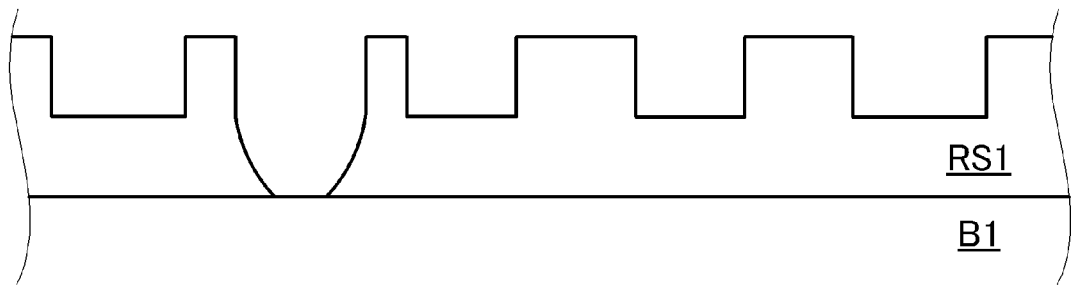
FIG. 5A shows a manner of manufacturing a shutter assembly in the first embodiment.

When manufacturing the shutter assembly M, a thick film resist RS1 is first applied on the first substrate B1 as shown in FIG. 5A, and the resist RS1 is processed by a lithography step (first lithography step). In the first lithography step of the embodiment, a halftone mask is used, and the processing of the resist RS1 required for forming each of the first supporting portion S1, the second supporting portion S2, the drive electrode E, the beam portion B, and the shutter plate SH is performed by one lithography step. In a mask pattern of the halftone mask in the embodiment, fully exposed portions correspond to hole forming parts of the first supporting portion S1 and the second supporting portions S2 in FIG. 3A, half exposed portions correspond to an area outside of the drive electrode E and inside of the beam portion B in FIG. 3A, and an area inside of a grid portion GR, and non-exposed portions correspond to an area inside of the drive electrode E, the inside of a portion formed, in plan view, in a U-shape in the first supporting portion S1, and the outside of the beam portion B and the grid portion GR.

Figure 5B:
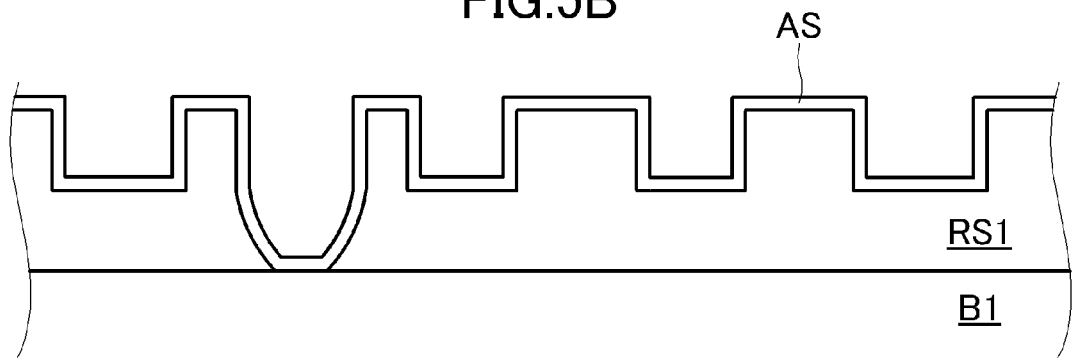
FIG. 5B shows the manner of manufacturing the shutter assembly in the first embodiment.
Figure 5C:
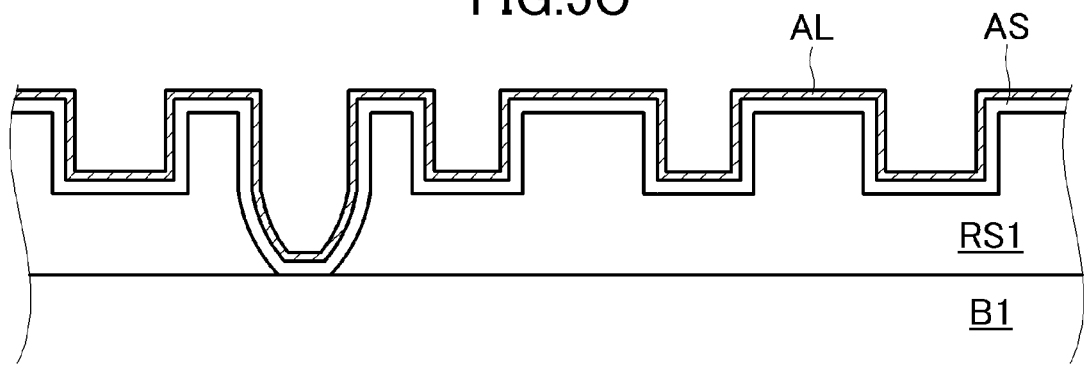
FIG. 5C shows the manner of manufacturing the shutter assembly in the first embodiment.

Next as shown in FIGS. 5B and 5C, the conductor layer AS is first deposited on the resist RS1, and further the metal layer AL is deposited thereon. In the embodiment, the conductor layer AS is deposited by a PECVD method while doping an impurity to amorphous silicon. However, another semiconductor such as, for example, SiGe, GaAs, CdSe, or InP may be used. The metal layer AL of the embodiment is an alloy mainly composed of aluminum (Al). However, another metal such as, for example, Cu, Ni, Mo, or Ta may be used. By the metal layer AL, light from the aperture AP is blocked.

Figure 5D:
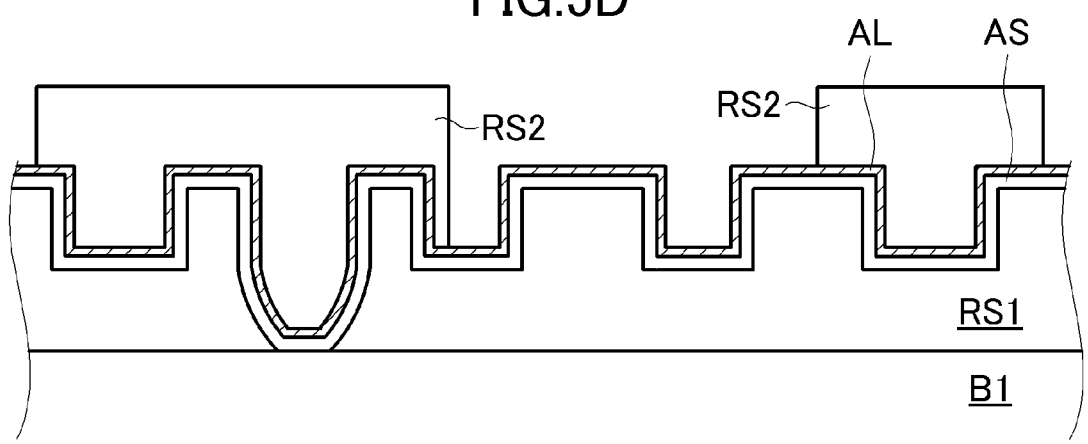
FIG. 5D shows the manner of manufacturing the shutter assembly in the first embodiment.

Thereafter as shown in FIG. 5D, a resist RS2 is applied, exposed, and developed through a second lithography step. Areas where the resist RS2 is formed in the second lithography step correspond to the areas where screentone is applied in FIG. 3A (that is, the areas of the first supporting portion S1, the second supporting portions S2, and the shutter plate SH).

Figure 5E:
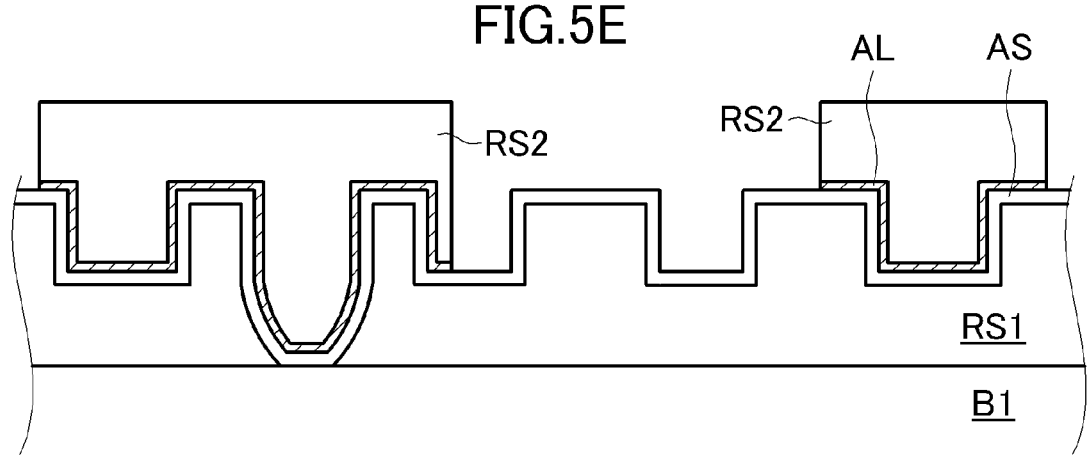
FIG. 5E shows the manner of manufacturing the shutter assembly in the first embodiment.
Figure 5F:
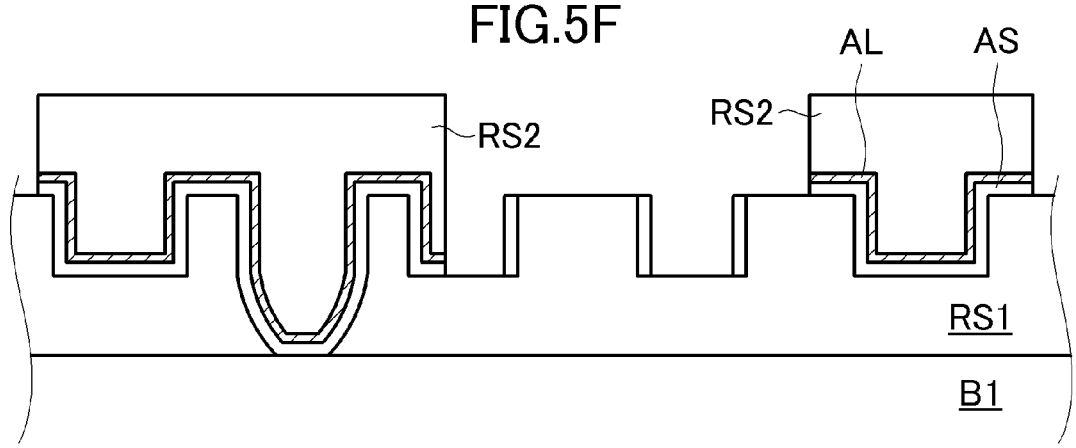
FIG. 5F shows the manner of manufacturing the shutter assembly in the first embodiment.
Figure 5G:
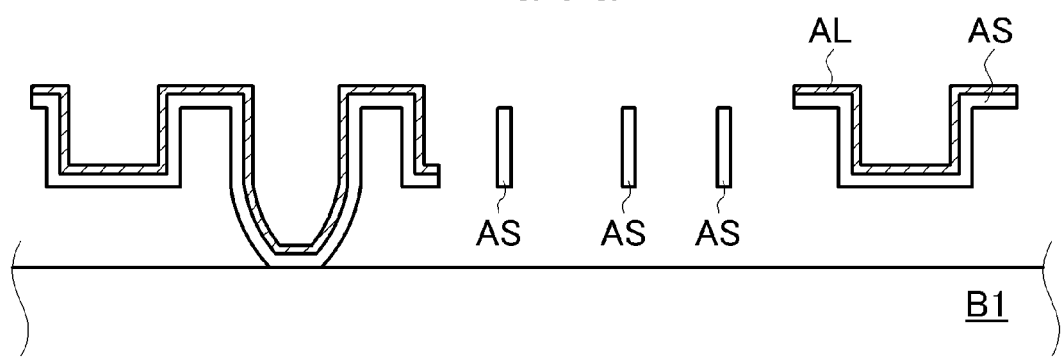
FIG. 5G shows the manner of manufacturing the shutter assembly in the first embodiment.

Next as shown in FIGS. 5E and 5F, a portion of the metal layer AL exposed from the resist RS2 is removed by wet etching, and the conductor layer AS is removed by anisotropic dry etching.

In the step of anisotropic dry etching shown in FIG. 5F, the conductor layer AS formed planary on the resist RS1 is removed, and the conductor layer AS formed on the pattern side-wall of the resist RS1 is left. By doing as described above, the conductor layer AS in the beam portion B or the drive electrode E is formed with a smaller width than the minimum design dimension of an exposure apparatus used in the first lithography step, so that the beam portion B or the drive electrode E can be formed with a structure which is elastically deformed easily.

Figure 5H:
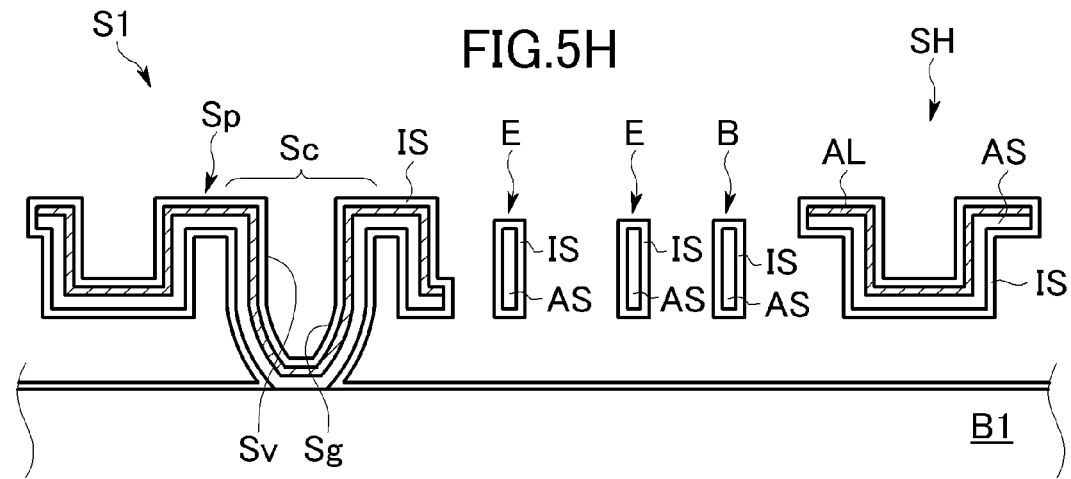
FIG. 5H shows the manner of manufacturing the shutter assembly in the first embodiment.

After the anisotropic dry etching of FIG. 5F, the resist RS1 used as a sacrificial layer and the resist RS2 are removed (FIG. 5G), and the insulating layer IS is formed by a CVD method on the circumferences of the left conductor layer AS and the left metal layer AL (FIG. 5H).

The shutter assembly M in the embodiment is formed by two photolithography steps through the manufacturing steps described above. Next, based on the manufacturing steps described above, the structure of the shutter assembly M will be further specifically described.

First as shown in the cross-sectional view of FIG. 4, the first supporting portion S1 has a planar portion Sp formed in a planar shape and a recessed portion Sc (anchor portion) formed to be concaved from the planar portion Sp toward the first substrate B1 (The recessed portion Sc is formed below the planar portion Sp). The first supporting portion S1 is connected at the bottom of the recessed portion Sc to the first substrate B1. Since the planar portion Sp is formed on the upper surface of the resist RS1, the planar portion Sp is formed apart from the first substrate B1 and substantially parallel to the first substrate B1.

The recessed portion Sc corresponds to the part which is fully exposed using the halftone mask in the first lithography step. In a shallow portion of the resist RS1, the pattern of the mask is faithfully transferred, so that the side-wall of the resist RS1 is processed so as to be substantially vertical. On the other hand, in a deep portion of the resist RS1, the pattern of the mask is hard to be faithfully transferred due to optical factors occurring in a resist material, such as the attenuation of exposure light or the focus misalignment. Therefore, the recessed portion Sc is formed to have a vertically formed portion Sv and an inclined portion Sg. The vertically formed portion Sv is formed to be inclined substantially vertically from the planar portion Sp. The inclined portion Sg starts from the lower end of the vertically formed portion Sv and has an inclination which becomes gradually gentle toward the first substrate B1. The inclined portion Sg whose inclination becomes gradually gentle is formed of a curved surface which is uninterruptedly continuous with the vertically formed portion Sv, and the recessed portion Sc is formed so as to be tapered. The term "substantially vertical" or "substantially vertically" used herein includes, addition to the case of being perfectly vertical, the case of being in a range of ±5.0 degrees or less relative to 90°. Moreover, manufacturing errors are also allowable. Similarly, the term "substantially parallel"

includes, in addition to the case of being perfectly parallel, the case of being in a range of ±5.0 degrees or less relative to 0°. Manufacturing errors are also allowable.

The first supporting portion S1 has the conductor layer AS, the metal layer AL stacked on the conductor layer AS, and the insulating layer IS covering the circumferences of the conductor layer AS and the metal layer AL. At the bottom of the recessed portion Sc, the conductor layer AS is formed such that the inclination thereof becomes gradually gentle toward the first substrate B1, and formed in a pan bottom shape so as to draw its skirt inwardly. The conductor layer AS is connected at the bottom in the recessed portion Sc to the first substrate B1, and formed to be substantially vertical to the first substrate B1 from the upper end of the portion formed in a pan bottom shape to the portion formed in a planar shape.

Since the recessed portion Sc is formed as described above, an area for a margin of position adjustment, being parallel to the first substrate B1, is not formed, so that the occurrence of the asymmetry of film stress due to the insulating layer IS is avoided. Moreover, in the inclined portion Sg whose inclination becomes gradually gentle in the recessed portion Sc, the adhesive property of the insulating layer IS is improved, whereby the mechanical strength of the first supporting portion S1 is enhanced and crack or the like is hard to occur.

In the embodiment, the second supporting portion S2 is formed at four points per actuator portion AC. Also in these second supporting portions S2, the recessed portion Sc similar to that of the first supporting portion S1 is formed. However, it is sufficient that the recessed portion Sc having the vertically formed portion Sv and the inclined portion Sg whose inclination becomes gradually gentle is formed in any one of the first supporting portion S1 and the four second supporting portions S2. With this configuration, the occurrence of the asymmetry of film stress which may occur in the actuator portion AC is lessened, and the mechanical strength is enhanced.

Moreover, in the embodiment, since the halftone mask is used as described above, the step of processing the resist RS1 is commonly used for forming the recessed portion Sc of the first supporting portion S1 to be connected to the first substrate B1 and for forming the portion to be suspended over the first substrate B1, and the drive electrode E, the beam portion B, and the shutter plate SH are formed at the half exposed parts. Therefore, the drive electrode E and the beam portion B are formed on the side of the first substrate B1 relative to the planar portion Sp of the actuator portion AC, and located lateral to the vertically formed portion Sv. By processing the resist RS1 serving as a sacrificial layer using the halftone mask in this manner, in addition to the lessening of the asymmetry of film stress and the enhancement of mechanical strength, the manufacturing steps are simplified.

Moreover, in the embodiment, since the conductor layer AS of the drive electrode E and the beam portion B is formed on the side-wall of the pattern in the half exposed resist RS1, the drive electrode E and the like have an aspect ratio greater in the depth direction than in the width direction. Since the drive electrode E and the like are formed to have a thin line width in this manner, it can be said that the drive electrode E and the like have a structure which is susceptible to the non-uniformity of film stress of the insulating layer IS. Moreover, the drive electrode E or the beam portion B is formed on the side-wall of the pattern of the resist RS1, similarly to the vertically formed portion Sv of the recessed portion Sc. Therefore as shown in FIG. 4 and the like, the drive electrode E or the beam portion B is located lateral to the vertically formed portion Sv, and formed substantially parallel to the vertically formed portion Sv.

Further, in the embodiment, the drive electrode E is formed, in plan view as shown in FIG. 3A and the like, such that an outer extension thereof is edged with a structure of the aspect ratio and that an inside thereof is hollow. On the other hand, the beam portion B is also similarly formed, with the structure of the aspect ratio described above, so as to surround a predetermined area (in the embodiment, the area where the first supporting portion S1 and the drive electrode E are disposed). Therefore, the drive electrode E or the beam portion B is formed with a structure which is sensitive to the non-uniformity of film stress, and the shutter assembly M having the drive electrode E or the beam portion B of the aspect ratio can be formed by two photolithography steps.

Moreover, the shutter plate SH formed in a plate shape is formed to have the grid portion GR as shown in FIG. 3A and the like. The grid portion GR is continuously connected to the beam portion B, and the grid portion GR and the beam portion B are formed using one continuous pattern shape in the halftone mask. The grid portion GR has a groove-like shape in the shutter plate SH formed in a plate shape. The shutter plate SH is reinforced by the grid portion GR, so that the rigidity of the shutter plate SH is assured when it is driven. Moreover, the grid portion GR is formed so as to surround the openings OP of the shutter plate SH as shown in FIG. 3A and the like. The grid portion GR has also portions formed to stride over the openings OP.

[Second Embodiment]

Figure 6:
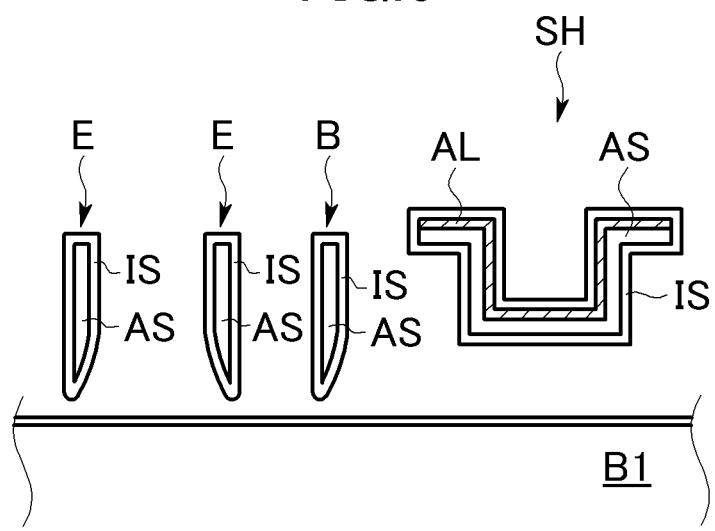
FIG. 6 shows a cross-section of a shutter assembly in a second embodiment.

Next, a second embodiment of the invention will be described. FIG. 6 shows cross-sections of the drive electrode E, the beam portion B, and the shutter plate SH in the second embodiment, showing a portion from the drive electrode E to the shutter plate SH in the IV-IV cross-section of FIG. 3A. The second embodiment is substantially similar to the first embodiment excepting that the area outside of the drive electrode E and inside of the beam portion B is formed by full exposure using a halftone mask of a first lithography step.

Figure 7A:
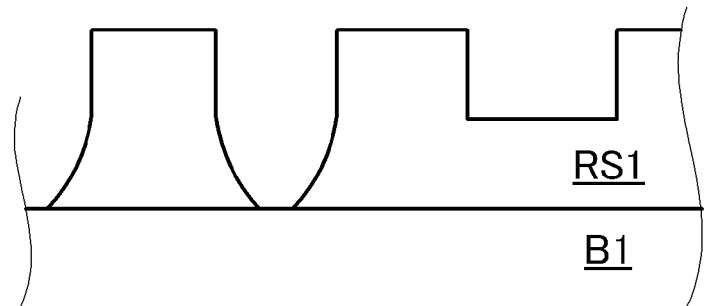
FIG. 7A shows a manner of manufacturing the shutter assembly in the second embodiment.
Figure 7B:
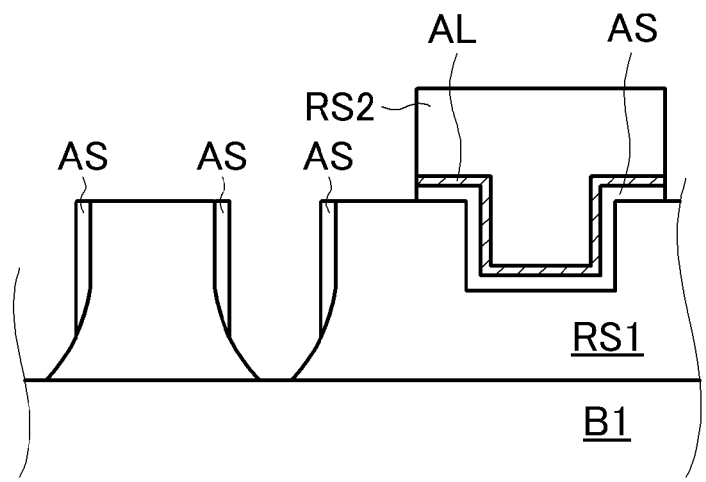
FIG. 7B shows the manner of manufacturing the shutter assembly in the second embodiment.
Figure 7C:
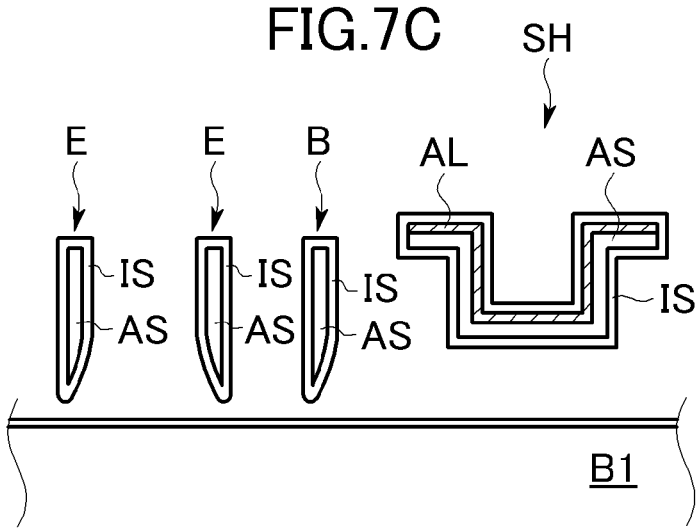
FIG. 7C shows the manner of manufacturing the shutter assembly in the second embodiment.
Figure 8A:
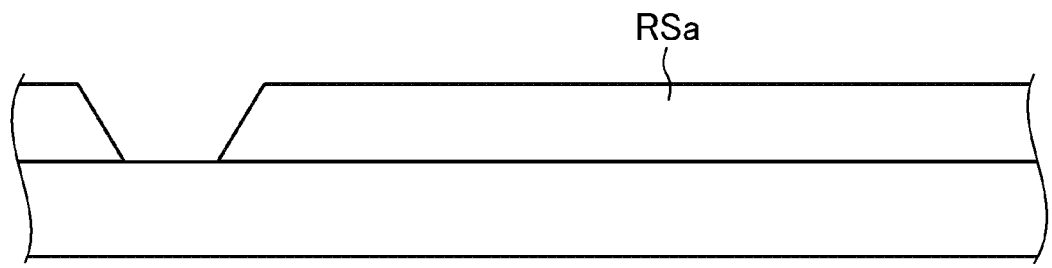
FIG. 8A shows a manner of manufacturing a shutter assembly in a reference example.
Figure 8B:
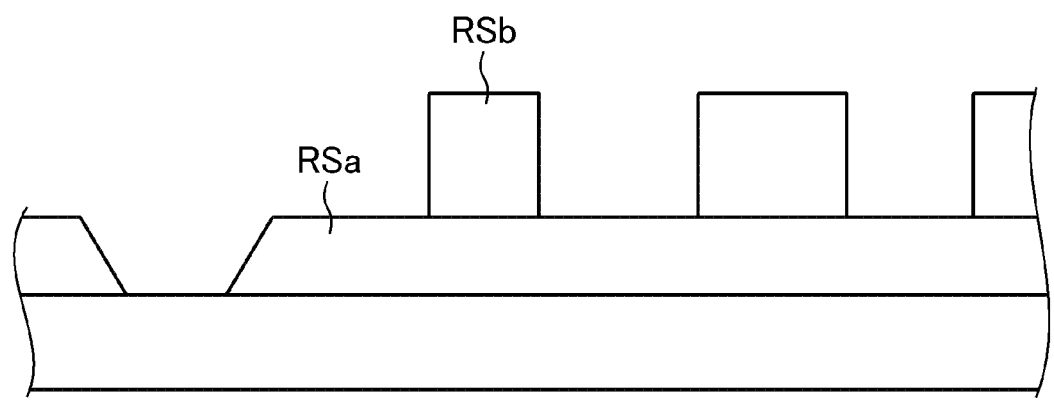
FIG. 8B shows the manner of manufacturing the shutter assembly in the reference example.
Figure 8C:
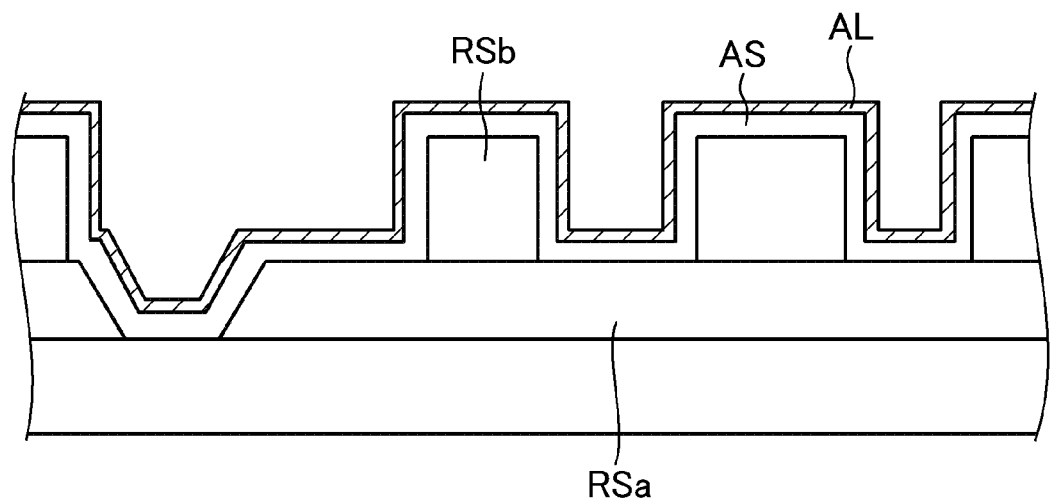
FIG. 8C shows the manner of manufacturing the shutter assembly in the reference example.
Figure 8D:
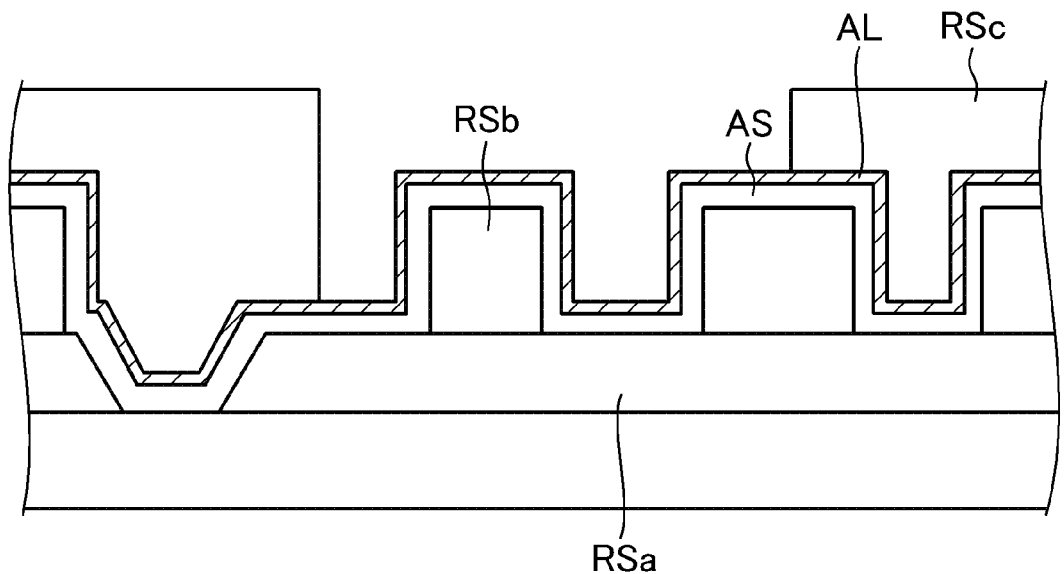
FIG. 8D shows the manner of manufacturing the shutter assembly in the reference example.
Figure 8E:
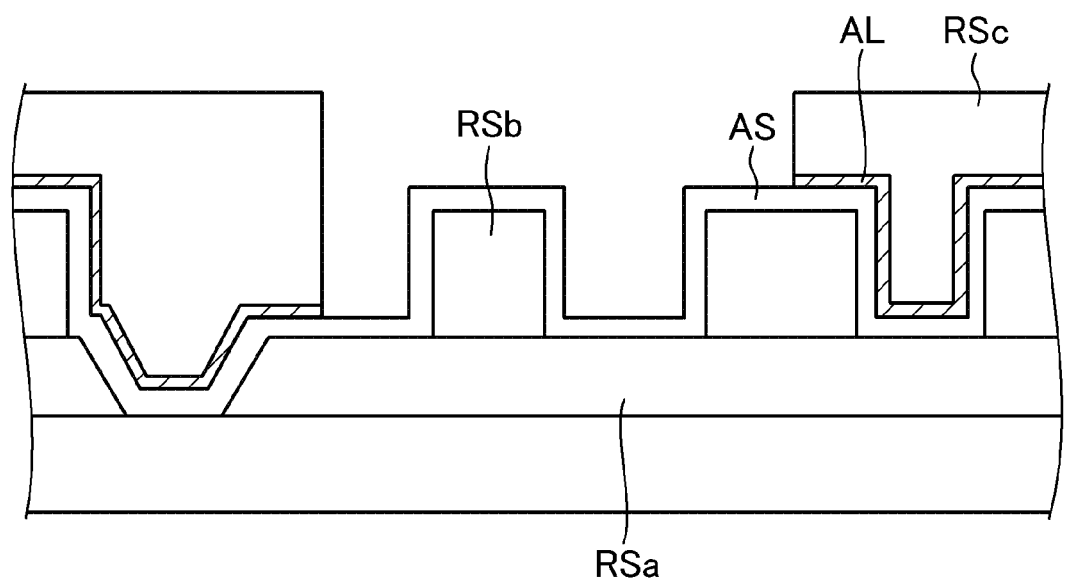
FIG. 8E shows the manner of manufacturing the shutter assembly in the reference example.
Figure 8F:
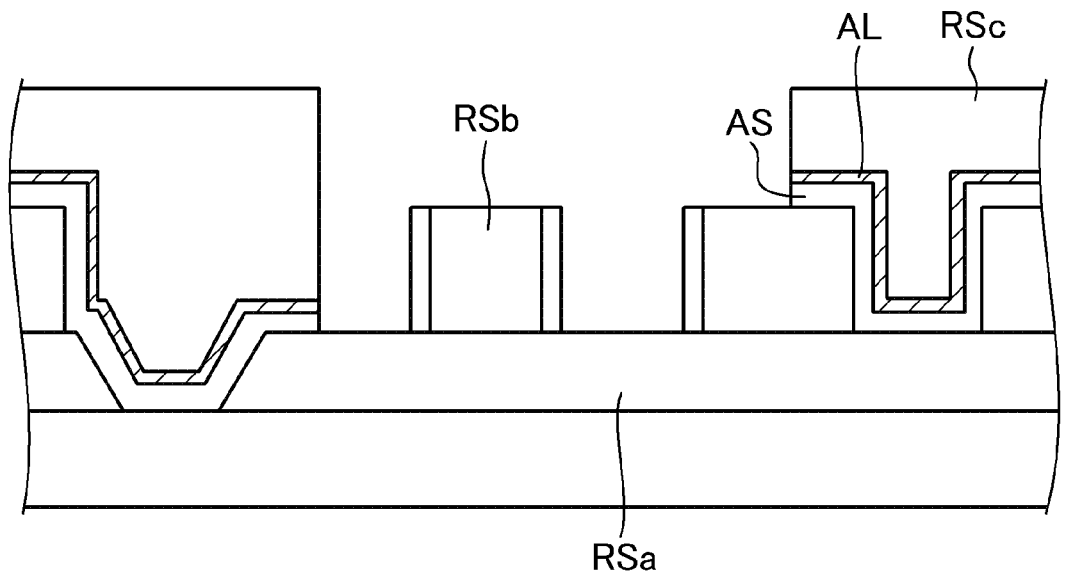
FIG. 8F shows the manner of manufacturing the shutter assembly in the reference example.
Figure 8G:
FIG. 8G shows the manner of manufacturing the shutter assembly in the reference example.
Figure 8H:
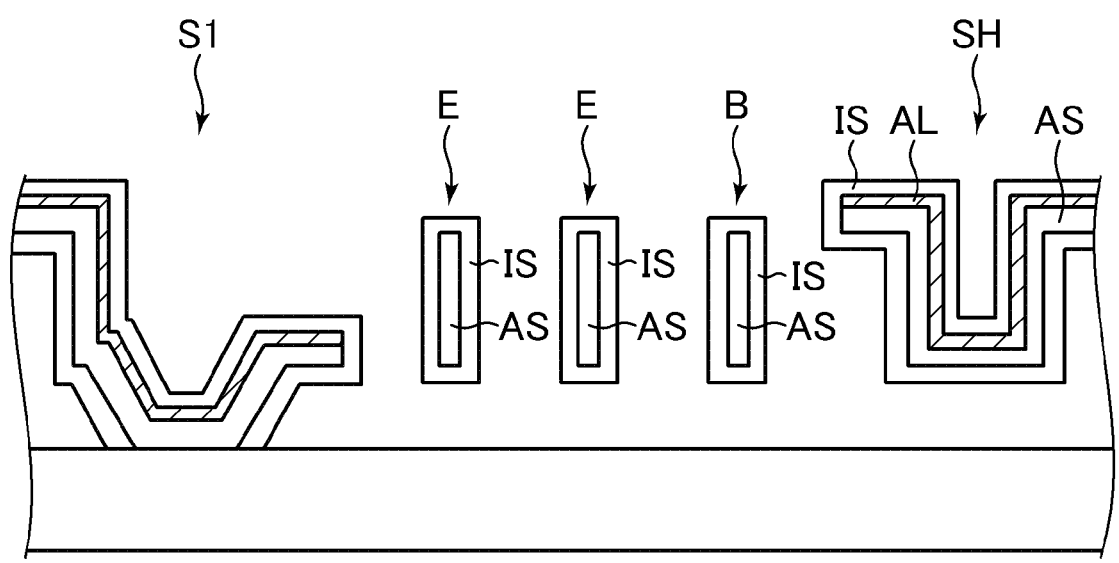
FIG. 8H shows the manner of manufacturing the shutter assembly in the reference example.

FIGS. 7A to 7C explain a manner of manufacturing the shutter assembly M in the second embodiment. First as shown in FIG. 7A, parts for forming the drive electrode E and the beam portion B in the resist RS1 serving as a sacrificial layer are processed by full exposure similarly to the part of the recessed portion Sc described in the first embodiment. Thereafter, anisotropic etching is applied through steps similar to those of FIGS. 5B to 5E. Then as shown in FIG. 7B, the inside of the pattern side-wall of the resist RS1 is processed, and the conductor layer AS formed at the bottom of the resist RS1 is removed. Therefore, when the insulating layer IS is deposited after removing the resist RS1, the drive electrode E and the beam portion B are formed to a position lower than the shutter plate SH as shown in FIG. 7C. Further, a tip of each of the drive electrode E and the beam portion B is formed so as to be pointed. This causes, in the drive electrode E and the beam portion B manufactured using a halftone mask, great variations in dimension in the plane direction and the vertical direction due to under-exposure. However, in the second embodiment of the invention, the drive electrode E and the beam portion B are processed by full exposure, and therefore can be manufactured with good uniformity.

The display device DP of each of the embodiments has the backlight BL. However, the display device DP may be a projection display device or a reflective display device which forms an image using reflection of environmental light coming from the viewer side of the display device.

In the display device DP in each of the embodiments, the first substrate B1 in which the thin film transistors are formed is disposed on the side of the backlight BL as shown in FIG. 1. However, the first substrate B1 in which the thin film transistors are formed may be disposed on the viewer side, and the substrate in which the apertures AP are formed may be disposed on the side of the backlight BL.

As the backlight BL, an FSC system (Field Sequential Color) may be adopted. As a system of generating gray scales, a time-division system which controls the time in which the shutter plate SH is in the open state may be adopted, or a system in which light incident from an opened pixel is reflected on the side of the backlight BL to use the scattering light may be adopted.

In the display device DP in each of the embodiments, the shutter assembly M has two actuator portions AC, and these actuator portions AC control the position of the shutter plate SH. However, the shutter assembly M may have only one actuator portion AC. In this case, when the pixel PX is brought from the closed state into the open state for example, a video signal is input to the actuator portion AC. When the pixel PX is brought from the open state to the closed state, a video signal to be input to the actuator portion AC may be turned off, and the shutter plate SH may be moved by the restoring force of the beam portion B.

Although the embodiments of the invention have been described as above, the invention is not limited to the embodiments described above but can be modified variously. For example, the configuration described in each of the embodiments can be replaced with substantially the same configuration, a configuration providing the same operational effect, or a configuration capable of achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a plurality of pixels each having a shutter plate formed in a plate shape and an actuator portion driving the shutter plate with an electrostatic force, wherein
    the actuator portion has
        a beam portion connected to the shutter plate,
        a drive electrode causing, in response to the application of a voltage thereto, the beam portion to bend to drive the shutter plate,
        a first supporting portion supporting the drive electrode and fixed on a substrate, and
        a second supporting portion supporting the beam portion and fixed on the substrate,
    at least one of the first supporting portion and the second supporting portion has
        a planar portion formed apart from and parallel to the substrate, and
        a recessed, tapered portion formed to be concaved from the planar portion and connected to the substrate, and
    the recessed, tapered portion has
        a vertically formed portion formed to be inclined substantially vertically from the planar portion, and
        a curved portion starting from the vertically formed portion and formed such that the inclination of the curved portion becomes gradually gentle toward the substrate.

2. The display device according to claim 1, wherein the drive electrode and the beam portion are formed on the side of the substrate relative to the planar portion.

3. The display device according to claim 1, wherein the drive electrode and the beam portion are formed with an aspect ratio greater in the depth direction than in the width direction.

4. The display device according to claim 3, wherein the first supporting portion has the recessed portion, and the drive electrode is formed, in plan view, such that an outer extension thereof is formed with a structure having the aspect ratio and that an inside thereof is hollow.

5. The display device according to claim 1, wherein the drive electrode and the beam portion are formed to a position deeper than the shutter plate.

6. The display device according to claim 5, wherein a tip of each of the drive electrode and the beam portion is formed to be pointed on the side of the substrate.

* * * * *